(12) United States Patent
Yamada

(10) Patent No.: US 6,930,762 B2
(45) Date of Patent: Aug. 16, 2005

(54) MASTER TRANSPORT APPARATUS

(75) Inventor: Kohei Yamada, Tochigi (JP)

(73) Assignee: Canon Kabushiki Kasiha, Tokyo (JP)

( * ) Notice: Subject to any disclaimer, the term of this patent is extended or adjusted under 35 U.S.C. 154(b) by 18 days.

(21) Appl. No.: 10/761,303

(22) Filed: Jan. 22, 2004

(65) Prior Publication Data

US 2004/0150808 A1 Aug. 5, 2004

(30) Foreign Application Priority Data

Jan. 27, 2003 (JP) .................................... 2003-017262

(51) Int. Cl.$^7$ ............................................. G03B 27/42
(52) U.S. Cl. ..................... 355/75; 700/121; 700/213; 700/228; 700/245; 414/222.09; 414/226.05
(58) Field of Search ........................... 355/53, 72, 75; 414/222.01, 222.09, 226.05; 700/121, 213, 228, 245

(56) References Cited

U.S. PATENT DOCUMENTS 5,740,052 A * 4/1998 Nakamura .................. 414/940
6,414,744 B1 * 7/2002 Kuiper et al. ................ 355/75
6,573,979 B2    6/2003 Yamada ....................... 355/72
6,642,997 B2   11/2003 Yamada ....................... 355/75
6,826,451 B2 * 11/2004 del Puerto et al. .......... 700/245

* cited by examiner

*Primary Examiner*—D. Rutledge
(74) *Attorney, Agent, or Firm*—Fitzpatrick, Cella, Harper & Scinto

(57) ABSTRACT

An exposure apparatus has a mask stage (9), a prealignment device (7) which prealigns a mask (1) to be transferred to the stage (9), and a manipulating mechanism (10) which transports a master or exchanges two masters between the stage (9) and prealignment device (7). A master transport apparatus (30) includes a mask transport mechanism (8) which holds the mask (1) with holding portions (8a, 8b) that can hold at least two masks (1) and transports the master (1), and a controller (11) which controls the transport mechanism (8). The controller (11) controls the transport mechanism (8) such that, when a mask (1) that should be used in a first turn for exposure is to be mounted on the stage (9), a mask (1) to be used in a second turn is provided to the prealignment device (7), and a mask (1) to be used in a third turn is held by the holding portion (8a, 8b).

14 Claims, 10 Drawing Sheets

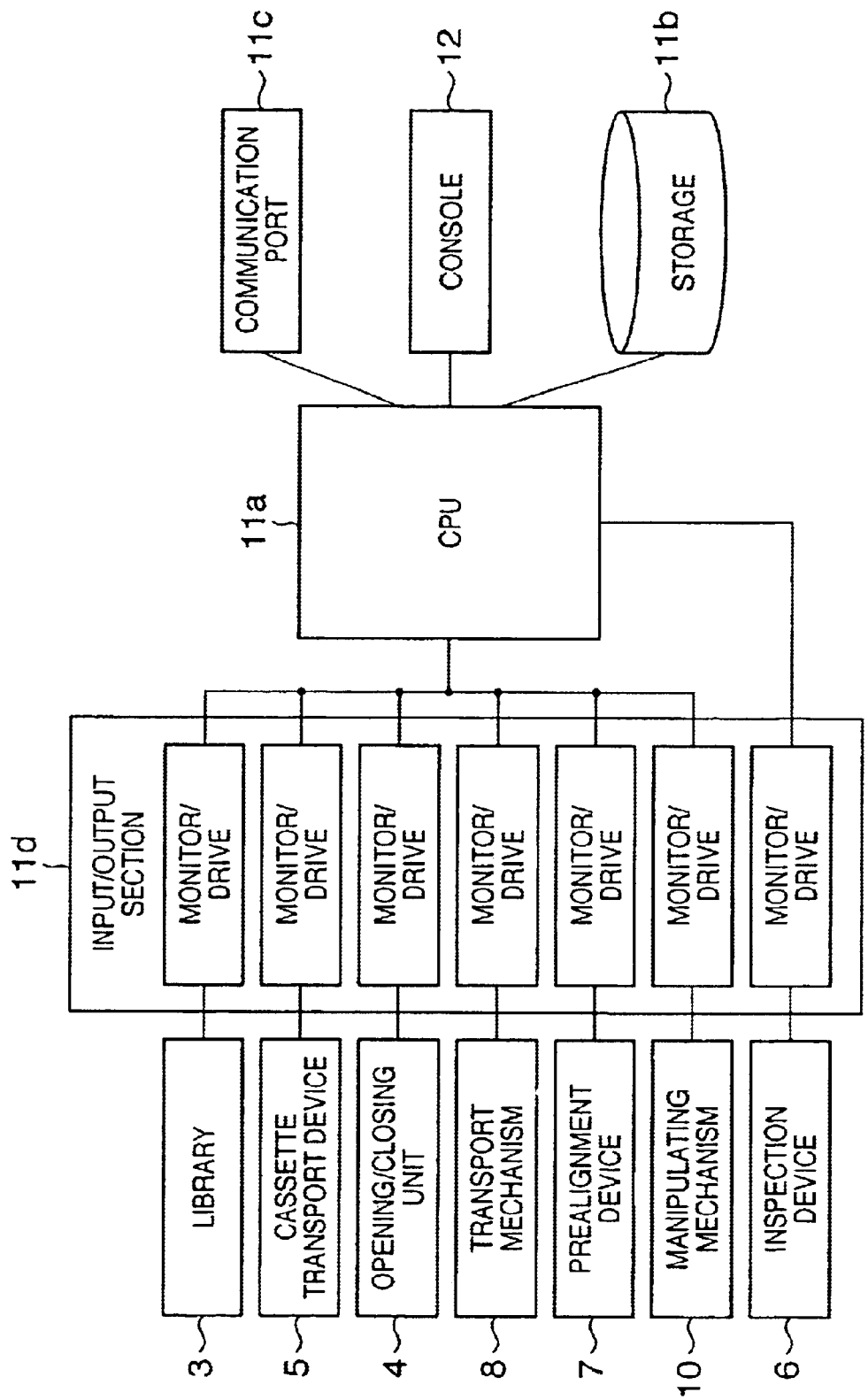

FIG. 4A

| | | |
|---|---|---|
| NUM | 4 | |
| ⋮ | | |
| MT1 | 1A | 1 |
| MT2 | 1B | 1 |
| MT3 | 1C | 1 |
| MT4 | 1D | 2 |
| MT5 | 1A | 3 |
| MT6 | 1E | 3 |
| | | |
| LB1 | 1A | |
| LB2 | 1B | |
| LB3 | 1C | |
| | | |
| LBn | 1n | |
| | | |
| LBx | 1x | |

FIG. 4B

| | | | |
|---|---|---|---|
| 401 — | NUM | 4 | |
| | : | | |
| 402 { | MT1 | 1B | 1 |
| | MT2 | 1C | 1 |
| | MT3 | 1A | 1 |
| | MT4 | 1D | 2 |
| | MT5 | 1A | 3 |
| | MT6 | 1E | 3 |
| | | | |
| 403 { | LB1 | 1A | RR |
| | LB2 | 1B | RS |
| | LB3 | 1C | PA |
| | : | | |
| | LBn | 1n | |
| | | | |
| | LBx | 1x | |

| | | | 40c |
|---|---|---|---|
| 401 | NUM | 4 | |
| | : | | |
| 402 { | MT1 | 1B | 1 |
| | MT2 | 1C | 1 |
| | MT3 | 1D | 2 |
| | MT4 | 1A | 3 |
| | MT5 | 1E | 3 |
| | MT6 | 1F | 4 |
| | | | |
| 403 { | LB1 | 1A | RR |
| | LB2 | 1B | RS |
| | LB3 | 1C | PA |
| | : | | |
| | LBn | 1n | |
| | : | | |
| | LBx | 1x | |

FIG. 4D

| | | 40d |
|---|---|---|
| 401 — NUM | 4 | |
| ⋮ | | |
| MT1 | 1C | 1 |
| MT2 | 1D | 2 |
| MT3 | 1A | 3 |
| 402 — MT4 | 1E | 3 |
| MT5 | 1F | 4 |
| MT6 | 1G | 4 |
| | | |
| LB1 | 1A | |
| LB2 | 1B | RR |
| LB3 | 1C | RS |
| 403 — ⋮ | | |
| LBn | 1n | |
| ⋮ | | |
| LBx | 1x | |

MASTER TRANSPORT APPARATUS

FIELD OF THE INVENTION

The present invention relates to a master transport apparatus for transporting a master to an exposure apparatus.

BACKGROUND OF THE INVENTION

A lithography process for semiconductor manufacturing uses a lithography system which projects and exposes a circuit pattern formed on a mask to a photoresist applied to a wafer.

FIG. 7 is a plan view showing the schematic arrangement of a conventional lithography system. A lithography system 100 has a master transport apparatus 130 for transporting a mask, a prealignment device 107, and an exposure section 120.

The master transport apparatus 130 is constituted by a library 103, cassette transport device 105, cassette opening/closing unit 104, mask transport mechanism 108, inspection device 106, controller (control section) 111, and the like. A mask 101 is accommodated in a cassette 102 which can be opened and closed, and is kept in stock in the library 103 which has a plurality of slots for storing masks 101.

The cassette transport device 105 transports the cassette 102 between the library 103 and opening/closing unit 104. The cassette transport device 105 can be constituted by, e.g., a cassette holding hand 105a, and a scalar type tri-articulated robot mechanism 105b which drives the hand 105a in R, θ, and Z directions (R is a radial direction, θ is a rotational direction within a horizontal plane, and Z is a vertical direction).

The opening/closing unit 104 has a plurality of slots for holding cassettes 102, a driving mechanism for driving an arbitrary slot to a predetermined height, and an opening/closing mechanism for opening/closing a cassette in a slot driven to the predetermined height (i.e., a target cassette from and to which a mask is to be unloaded and loaded).

The inspection device 106 has an inspection table (not shown), and measures particles attaching to a pellicle (not shown) adhered to the pattern surface side of the mask 101 placed on the inspection table and to the respective surfaces of the blank of the mask 101.

The prealignment device 107 prealigns (roughly aligns) the mask 101 before it is provided to a mask stage (master stage) 109.

The mask transport mechanism 108 has one holding hand 108a, and a tri-articulated robot 108c for extending/contracting the holding hand 108a, and transports the mask 101 among the cassette opening/closing unit 104, inspection device 106, and prealignment device 107.

The exposure section 120 has the mask stage (master stage) 109 which receives and holds the mask 101 prealigned by the prealignment device 107, a mechanism which finely aligns the mask 101 held on the mask stage 109, an illumination system which illuminates the mask 101, a projection system which projects the pattern of the mask 101, a wafer stage which positions a wafer (substrate), and the like, and exposes the wafer with the pattern of the mask 101.

A mask manipulating mechanism 110 has two holding hands 110a and 110b. The mask manipulating mechanism 110 holds the mask 101 with the hands 110a and 110b, and transports the mask 101 or exchanges two mask 101 between the prealignment device 107 and reticle stage 109.

The mask manipulating mechanism 110 may transport the mask 101 or exchange the two masks 101 by rotating a turntable. More specifically, the mask manipulating mechanism 110 may have first and second holding portions 110a and 110b on its turntable. According to this arrangement, for example, the first holding portion 110a holds a mask used, and the second holding portion 110b holds a mask to be used next (prealigned mask). In this state, the turntable is rotated, so that the first and second holding portions 110a and 110b are rotated (revolve) through 180° about their middle point as the center. Thus, the mask used and held by the first holding portion 110a can be unloaded from the mask stage 109 to the prealignment stage of the prealignment device 107, and the mask held by the second holding portion 110b, which is to be used next, can be loaded from the prealignment stage to the mask stage 109.

When exposure of the mask using the mask 101 is ended, the mask 101 used is transported to the prealignment device 107 by the manipulating mechanism 110. After that, the mask 101 used is accommodated in the corresponding cassette in the cassette opening/closing unit 104 by the transport mechanism 108. A mask 101 to be used next is extracted from a cassette in the cassette opening/closing unit 104 by the transport mechanism 108, and is transported to the inspection device 106, so that any foreign substance on it is inspected. The inspected mask 101 is transferred to the prealignment device 107 by the transport mechanism 108.

In the production of system LSIs or the like, the lot size decreases, and accordingly the mask exchange frequency increases, so that reduction in the mask exchange time accompanying mask exchange is sought for.

Demand has arisen for multiple exposure (a technique of forming a finer circuit by printing the circuit patterns of a plurality of masks in an overlaying manner) which is becoming popular as a micropatterning technique. To meet this demand in multiple exposure, the existing system has, e.g., the following problems. In the case of double exposure, it takes a long period of time to transport a mask which is to be used next. This produces a waiting time on the mask stage and decreases the rate of operation of the apparatus. In the case of triple exposure, to expose one wafer, at least one mask must be stored in the mask cassette. Accordingly, the possibility of contaminating the mask increases, and attaching of a foreign substance to the mask must be inspected again. This increases the mask exchange time and decreases the throughput largely. Demand has arisen for minimizing a decrease in throughput in multiple exposure as well as the contamination risk for the mask which is to be reused.

SUMMARY OF THE INVENTION

The present invention has been made in view of the above demands or problems and, for example, has as its object to suppress a decrease in throughput caused by exchange of a master such as a mask.

The present invention, according to its one aspect, relates to a master transport apparatus which transports a master to an exposure apparatus. The exposure apparatus which can be suitably used together with the master transport apparatus of the present invention has a master stage, a prealignment device which prealigns a master to be transferred to the master stage, and a manipulating mechanism which transports the master or exchanges two masters between the master stage and prealignment device, to expose a substrate with a pattern of the master. The master transport apparatus of the present invention comprises a transport mechanism which holds the master with a holding portion that can hold at least two masters and transports the master, and a control section which controls the transport mechanism. The control section controls the transport mechanism such that, when a master that should be used in a first turn for exposure is to be mounted on the master stage, a master to be used in a second turn is provided to the prealignment device, and a master to be used in a third turn is held by the holding portion.

According to a preferred embodiment of the present invention, the control section preferably controls the transport mechanism such that, when a master that has been used for exposure in the exposure apparatus should be used for next exposure in a turn a number of which is not larger than that of a predetermined turn, the master is held by the prealignment device if the turn thereof is second, and the master is held by the holding portion if the turn thereof is third, and preferably controls the transport mechanism such that, as far as a number of the turn of the master is larger than that of the predetermined turn, the master is returned to a master supply section.

According to a preferred embodiment of the present invention, the control section preferably controls the transport mechanism such that, when a master that should be used first for exposure is to be mounted on the master stage, a master to be used in a fourth turn is provided to an additional device that inspects, manipulates, or processes the master. For example, the additional device includes a device that inspects a foreign substance attaching to the master. The control section preferably controls the transport mechanism such that, as far as a master that has been used for exposure in the exposure apparatus should be used for next exposure in a turn a number of which is not larger than that of a predetermined turn, the master is held by the prealignment device if the turn thereof is second, the master is held by the holding portion if the turn thereof is third, and the master is provided to the additional device if the turn thereof is fourth, and preferably controls the transport mechanism such that, as far as a number of the turn of the master is larger than that of the predetermined turn, the master is returned to a master supply section.

According to a preferred embodiment of the present invention, the master supply section preferably has a mechanism that holds a cassette to accommodate the master and opens/closes the cassette, and the transport mechanism preferably receives the master from the cassette or transfers the master to the cassette.

The present invention, according to its second aspect, relates to an exposure apparatus which exposes a substrate with a pattern of a master. The exposure apparatus comprises a master stage, a prealignment device which prealigns a master to be transferred to the master stage, a manipulating mechanism which transports the master or exchanges two masters between the master stage and prealignment device, a transport mechanism which holds a master with a holding portion that can hold at least two masters and transports the master, and a control section which controls the transport mechanism. The control section controls the transport mechanism such that, when a master that should be used in a first turn for exposure is to be mounted on the master stage, a master to be used in a second turn is provided to the prealignment device, and a master to be used in a third turn is held by the holding portion.

According to a preferred embodiment of the present invention, the control section of the exposure apparatus preferably controls the transport mechanism such that, when a master that should be used first for exposure is to be mounted on the master stage, a master to be used in a fourth turn is provided to an additional device that inspects, manipulates, or processes the master. The additional device preferably includes a device that inspects a foreign substance attaching to the master.

The present invention, according to its third aspect, relates to a master transport method of transporting a master to an exposure apparatus having a master stage, a prealignment device which prealigns a master to be transferred to the master stage, and a manipulating mechanism which transports the master or exchanges two masters between the master stage and prealignment device, to expose a substrate with a pattern of the master. The method includes a control step of controlling a transport mechanism which holds the master with a holding portion that can hold at least two masters and transports the master. In the control step, the transport mechanism is controlled such that, when a master that should be used in a first turn for exposure is to be mounted on the master stage, a master to be used in a second turn is provided to the prealignment device, and a master to be used in a third turn is held by the holding portion.

According to a preferred embodiment of the present invention, in the control step, the transport mechanism is preferably controlled such that, when the master that should be used first for exposure is to be mounted on the master stage, a master to be used in a fourth turn is provided to an additional device that inspects, manipulates, or processes the master.

The present invention, according to its fourth aspect, relates to a device manufacturing method including steps of arranging a first master to be used in the first turn on the master stage in accordance with the above master transport method, arranging a second master to be used in the second turn on the master stage in place of the first master, and arranging a third master to be used in the third turn on the master stage in place of the second master, wherein each time one of the first to third masters is arranged on the master stage, a pattern of the arranged master is transferred to a substrate. When the additional device is provided or to be used, the master transport method may further include a step of arranging a fourth master to be used in a fourth turn on the master stage in place of the third master. Each time one of the first to fourth masters is arranged on the master stage, a pattern of the arranged master can be transferred to the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 is a block diagram showing a configuration of a controller that controls a master transport apparatus;

FIGS. 4A to 4D are tables which exemplify mask management tables to be stored in a storage 11b;

DETAILED DESCRIPTION OF THE PREFERRED EMBODIMENTS

The preferred embodiments of the present invention will be described with reference to the accompanying drawings.

Figure 1:
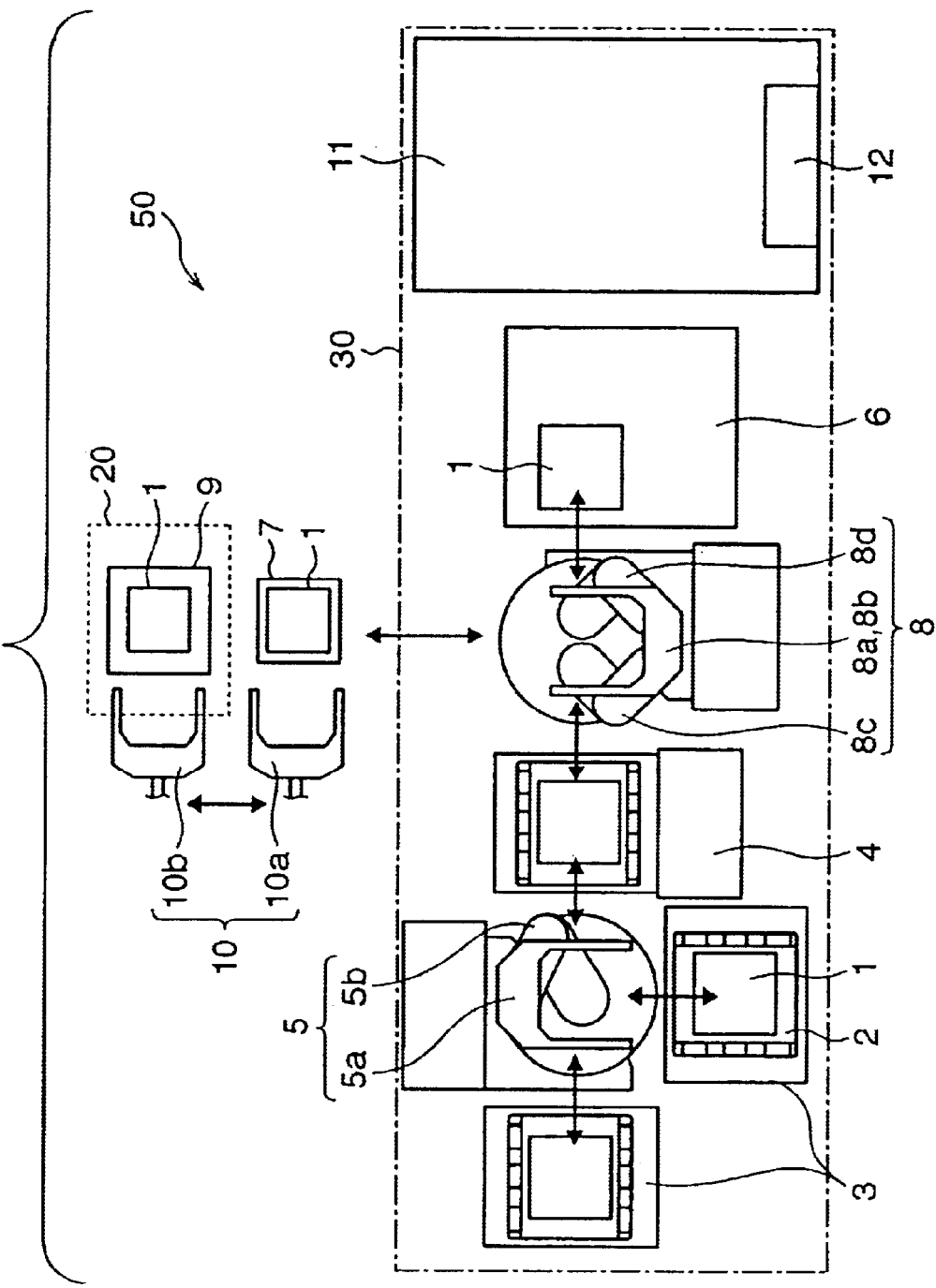
FIG. 1 is a plan view schematically showing the structure of a lithography system according to a preferred embodiment of the present invention.
Figure 2:
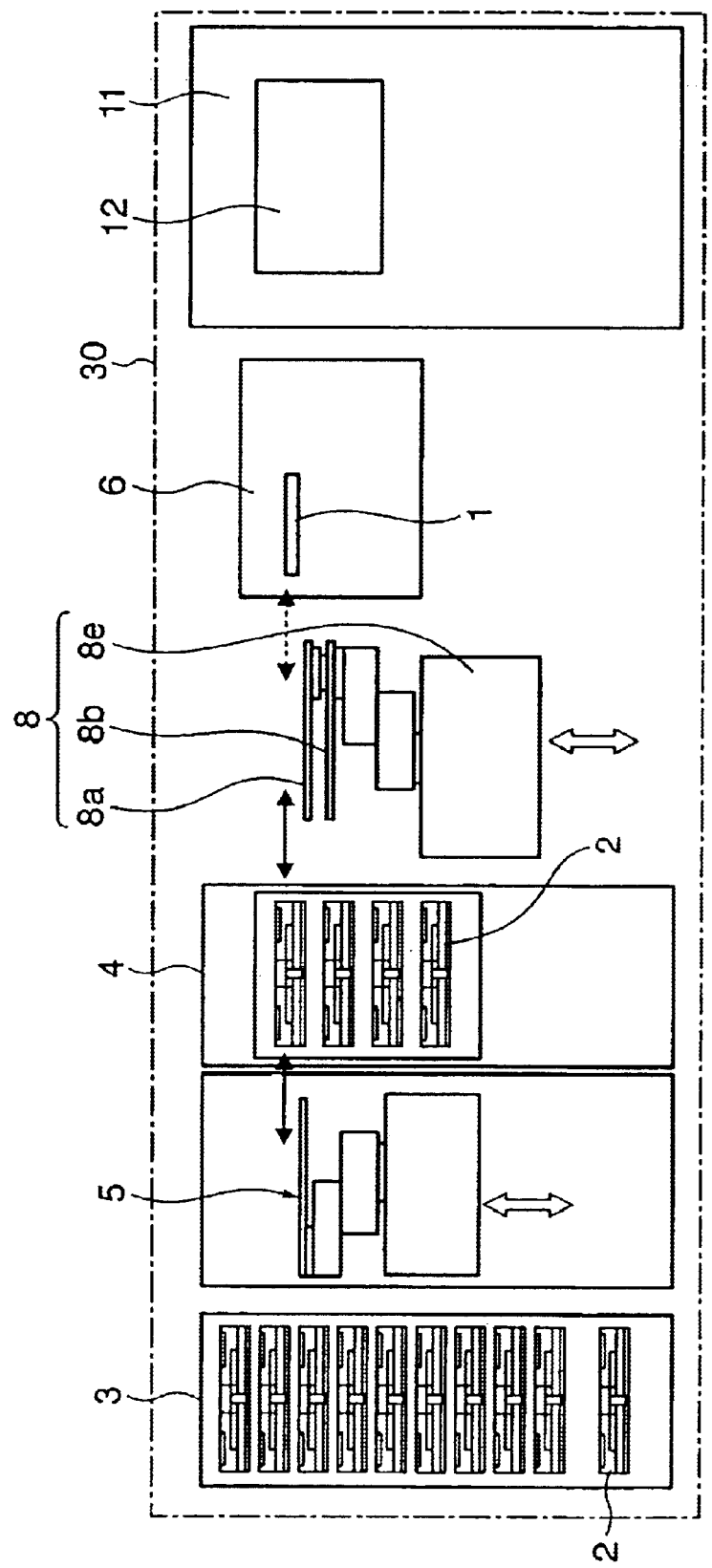
FIG. 2 is a front view schematically showing the structure of the lithography system according to the preferred embodiment of the present invention shown in FIG. 1.

FIGS. 1 and 2 are plan and front views, respectively, schematically showing the structure of a lithography system according to a preferred embodiment of the present invention. The whole portion of a lithography system 50 shown in FIGS. 1 and 2 may be called an exposure apparatus, or part (e.g., an exposure section 20, or the exposure section 20 and a prealignment device 7) of the lithography system 50 may be called an exposure apparatus.

The lithography system 50 has the prealignment device 7 and exposure section 20, and a master transport apparatus 30 which transports a mask (master).

The master transport apparatus 30 can be constituted by a library 3, cassette transport device 5, cassette opening/closing unit 4, mask transport mechanism 8, inspection device (additional device) 6, controller 11, and the like. A mask (master) 1 can be accommodated in a cassette 2 which can be opened and closed (i.e., to and from which the mask 1 can be loaded and unloaded), and can be kept in stock in the library 3 which has a plurality of slots for storing masks 1.

The cassette transport device 5 transports the cassette 2 between the library 3 and opening/closing unit 4. The cassette transport device 5 can be constituted by, e.g., a cassette holding hand 5a, and a scalar type tri-articulated robot mechanism 5b which drives the hand 5a in R, θ, and Z directions (R is a radial direction, θ is a rotational direction within a horizontal plane, and Z is a vertical direction).

The cassette opening/closing unit 4 has a plurality of (e.g., 5) slots for holding cassettes 2, a driving mechanism for driving an arbitrary slot to a predetermined height, and an opening/closing mechanism for opening/closing a cassette in a slot driven to the predetermined height (i.e., a target cassette from and to which a mask is to be unloaded and loaded).

The inspection device 6 inspects the mask 1, has an inspection table (not shown), and measures the mask 1 placed on the inspection table. For example, the inspection device 6 can be formed as a device that measures particles attaching to a pellicle (not shown) adhered to the pattern surface side of the mask 1 and to the respective surfaces of the blank of the mask 1.

The prealignment device 7 prealigns (roughly aligns) the mask 1 before it is provided to a mask stage (master stage) 9. For example, the prealignment device 7 holds the mask 1 on the prealignment stage, and prealigns the mask 1 with reference to its outer circumference, center, alignment mark, or the like. The prealignment device 7 can be formed as a constituent element independent of the exposure section 20, or as part of the exposure section 20.

The mask transport mechanism 8 has two holding hands (holding portions) 8a and 8b and a driving mechanism for the holding hands 8a and 8b. The driving mechanism has tri-articulated arms 8c and 8d for stretching and contracting the holding hands 8a and 8b, and a pivoting/elevating mechanism 8e for pivoting and elevating the arms 8c and 8d integrally. The transport mechanism 8 can have independent driving mechanisms for the respective holding hands 8a and 8b. Three or more holding hands can be provided. As the transport mechanism 8 has the two holding hands 8a and 8b, even when it holds one mask, it can transport another mask among a cassette 2 in the opening/closing unit 4, the inspection device 6, and the prealignment device 7.

The controller 11 controls transport of the mask and operations associated with it, and has a console 12.

For example, the exposure section 20 has the mask stage (master stage) 9 which receives and holds the mask 1 prealigned by the prealignment device 7, a mechanism which finely aligns the mask 1 held by the mask stage 9, an illumination system which illuminates the mask 1, a projection system which projects the pattern of the mask 1, a wafer stage which positions a wafer (substrate), and the like, and exposes the wafer with the pattern of the mask 1.

A mask manipulating mechanism 10 has two holding hands 10a and 10b. The mask manipulating mechanism 10 holds the mask 1 with the hands 10a and 10b, and transports the mask 1 or exchanges two masks 1 between the prealignment device 7 and reticle stage 9.

The mask manipulating mechanism 1 may transport the mask 1 or exchange the two masks 1 by rotating a turntable. More specifically, the mask manipulating mechanism 10 may have first and second holding portions 10a and 10b on its turntable. According to this arrangement, for example, the first holding portion 10a holds a mask used, and the second holding portion 10b holds a mask to be used next (prealigned mask). In this state, the turntable is rotated, so that the first and second holding portions 10a and 10b are rotated (revolve) through 180° about their middle point as the center. Thus, the mask used and held by the first holding portion 10a can be unloaded from the mask stage 9 to the prealignment stage of the prealignment device 7, and the mask held by the second holding portion 10b, which is to be used next, can be loaded from the prealignment stage to the mask stage 9.

FIG. 3 is a block diagram showing a configuration of the controller 11. The controller 11 has a CPU 11a, a storage 11b, a communication port 11c for communicating with a host controller, and an input/output section 11d for monitoring and driving the respective units 3 to 8 and 10.

FIGS. 4A to 4D are tables which exemplify mask management tables to be stored in the storage 11b. As shown in FIGS. 4A to 4D, the storage 11b has an area for storing a maximum number of masks (NUM) that can be extracted from a cassette at one time, an area for storing a use order table 402 where information for specifying six masks 1 to be used are registered in the order (MT1 to MT6) with which they should be used, and an area for storing a mask information table 403 which specifies the masks in the cassettes stored in the respective slots (LB1 to LBx) of the library 3.

Control operation for the transport of the mask with the controller 11 and for operation associated with it will be described. The control device 11 confirms the hardware configuration when the master transport apparatus 30 is initialized. If an inspection device (additional device) 6 exists, the control device 11 sets NUM=4; if not, NUM=3, and waits for a transport instruction for the mask 1.

This will be exemplified with reference to FIG. 4A. When mask ID="1A" as a mask to be transported and job No="1" as the number of a job that uses this mask are input from the host controller (e.g., a device that comprehensively controls the exposure section 20, prealignment device 7, and master transport apparatus 30) or console 12, the controller 11 looks up the mask information table 403 to collate with the mask IDs (LB1 to LBn) of the respective masks stored in the library 3. If a corresponding mask is present, the controller 11 writes mask ID="1A" and job No="1" at "MT1" of the use order table 402, and causes the cassette transport device 5 to transport a cassette that stores the corresponding mask 1A. If a corresponding mask is not present, the controller 11 sends a warning to the host controller or console 12.

When mask ID="1B" as the mask to be transported next and job No="1" as the number of a job that uses this mask are input, the controller 11 looks up the mask information table 403 again to collate with the mask IDs (LB1 to LBn) of the respective masks stored in the library 3. If a corresponding mask is present, the controller 11 writes mask ID="1B" and job No="1" at "MT2" of the use order table 402.

In this manner, information on six masks are written at MT1 to MT6 in the order of use.

The example shown in FIG. 4A indicates that three masks 1A, 1B, and 1C assigned to MT1 to MT3 are to be used in job 1, that is, triple exposure is to be performed by using the three masks. The example also indicates that one mask 1D assigned to MT4 is to be used in job 2, that is, single exposure is to be performed by using only one mask. The example also indicates that two masks, i.e., the mask 1A and a mask 1E assigned to MT5 and MT6 are to be used in job 3, that is, double exposure is to be performed by using the two masks. Note that the same mask 1A is to be used in MT1 and MT5.

Figure 5:
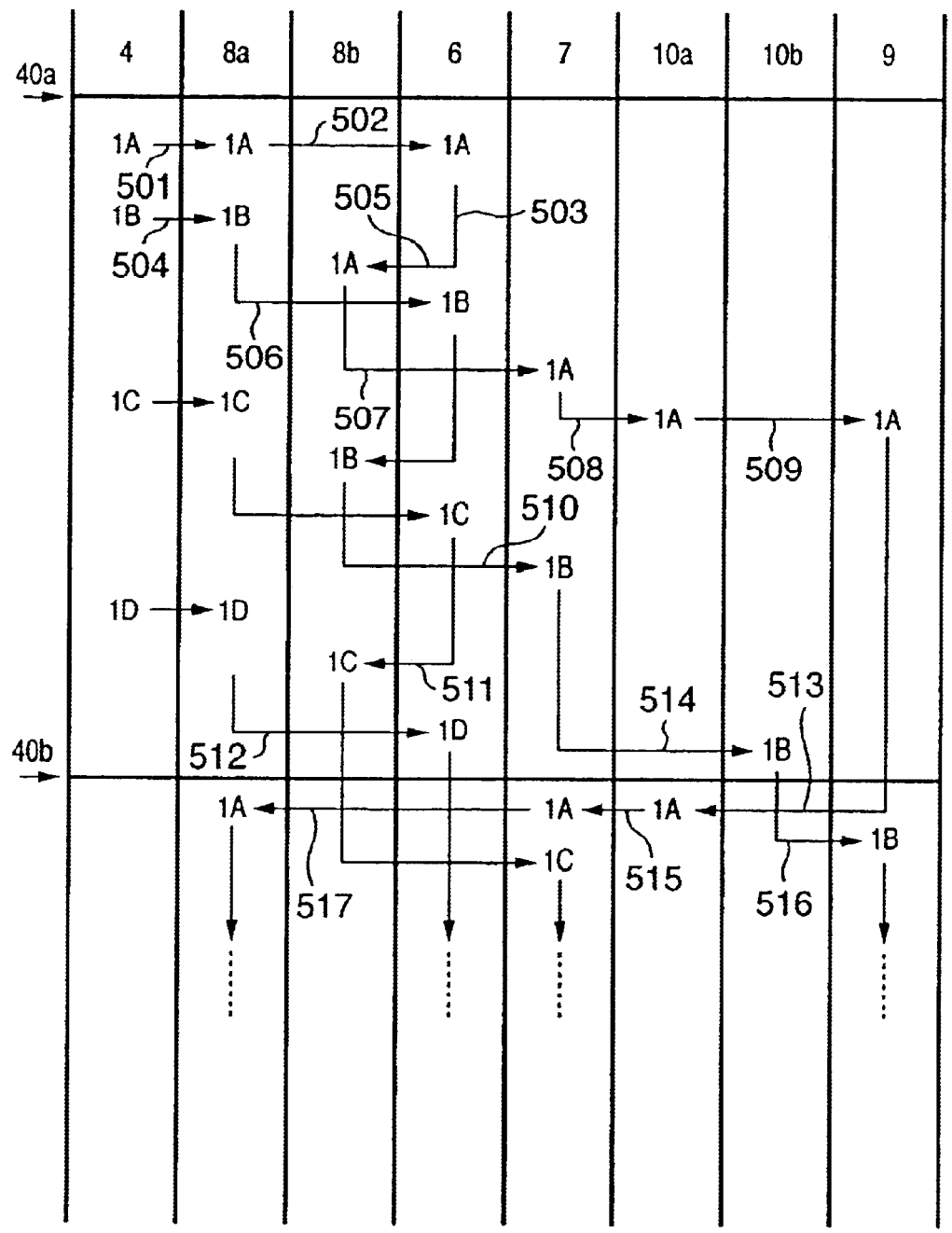
FIG. 5 explains a practical control example of mask transport with the controller.
Figure 6:
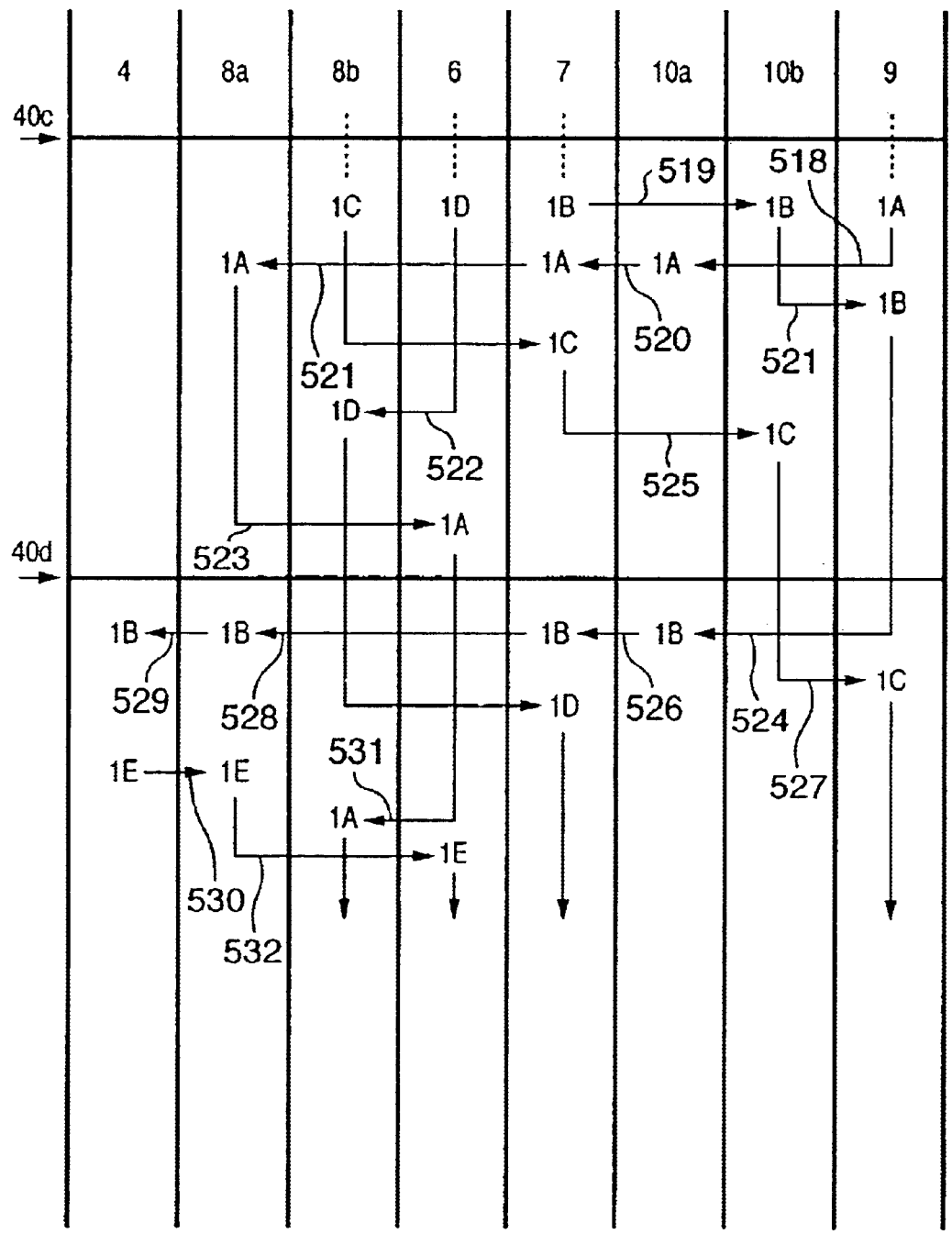
FIG. 6 explains a practical control example of mask transport with the controller.
Figure 7:
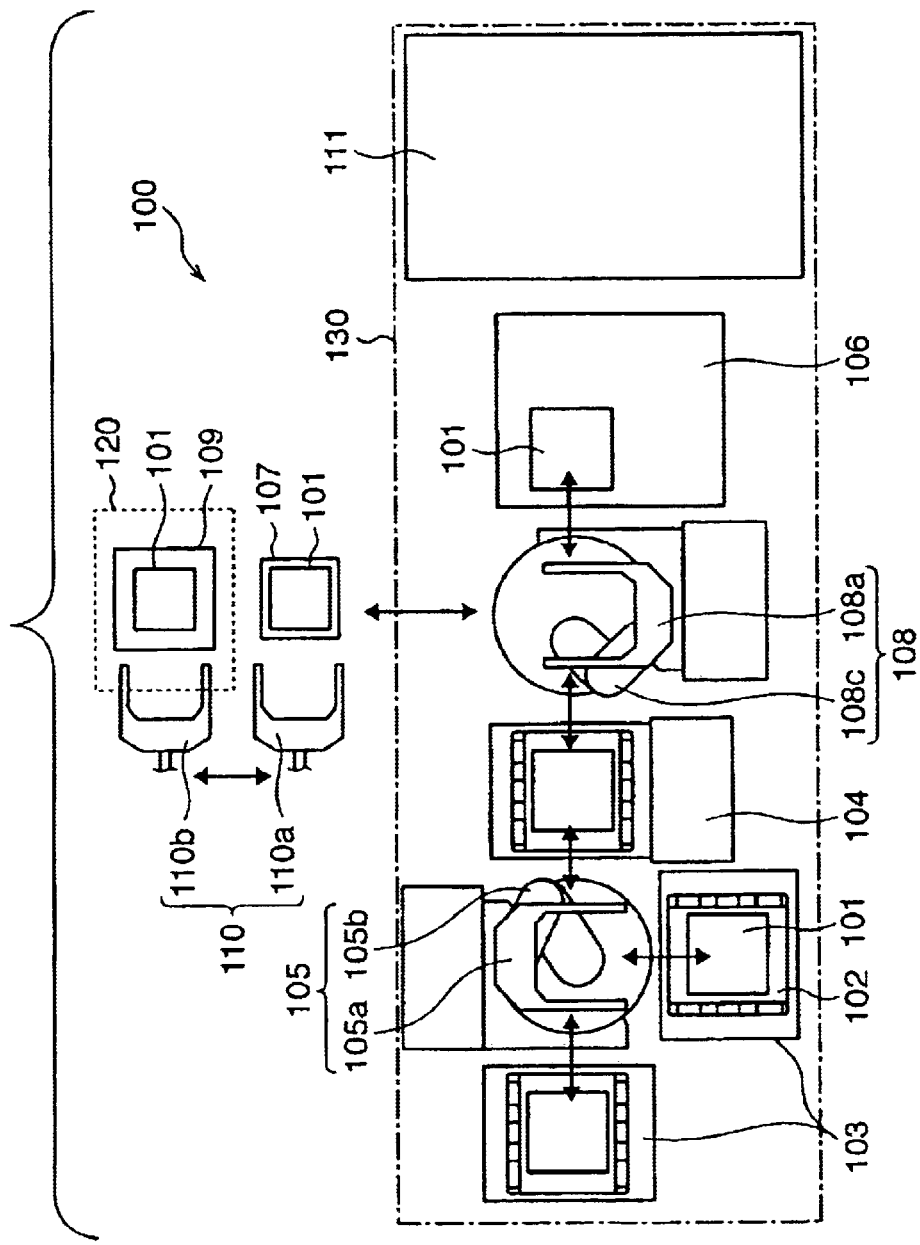
FIG. 7 is a plan view showing the schematic arrangement of a conventional lithography system.

A practical control example of mask transport with the controller 11 will be described with reference to FIGS. 4A to 4D and FIGS. 5 and 6. FIGS. 5 and 6 show the flow of masks, in which reference numerals 1A to 1E denote masks (mask ID); 4, the opening/closing unit; 8a, the first holding hand 8a of the transport mechanism 8; 8b, the second holding hand of the transport mechanism 8; 6, the inspection device; 7, the prealignment device; 10a, the first holding hand of the manipulating mechanism 10; 10b, the second holding hand of the manipulating mechanism 10; 9, the mask stage; and 40a to 40d, the mask management tables in the storage 11b shown in FIGS. 4A to 4D.

In the following procedure, the mask management table in the storage 11b will be updated in the order of FIG. 4A, FIG. 4B, FIG. 4C, and FIG. 4D. Assume that the mask-management table 40a as shown in FIG. 4A will be prepared in the storage 11b as the mask management table. The controller 11 controls transport of the mask and associated operations while looking up the mask management table.

First, under the control of the controller 11, the cassette transport mechanism 5 extracts a cassette 2 that stores a mask 1A corresponding to MT1 (mask to be used for first exposure) from a corresponding slot of the library 3, and stores it in an arbitrary empty slot of the opening/closing unit 4. Furthermore, under the control of the controller 11, the cassette transport mechanism 5 transports cassettes corresponding to MT2 to MT6 to the opening/closing unit 4 until the slots of the opening/closing unit 4 become full.

Subsequently, under the control of the controller 11, the opening/closing unit 4 opens the cassette 2 which accommodates the mask 1A. Under the control of the controller 11, the mask transport mechanism 8 extracts the mask 1A from a corresponding cassette 2 in the opening/closing unit 4 with the mask holding hand 8a (501), and places it on the inspection table (not shown) in the inspection device 6 (502). The inspection device 6 starts inspection of the mask 1A under the control of the controller 11 (503). At this time, under the control of the controller 11, the opening/closing unit 4 closes the cassette 2 that has accommodated the mask 1A, moves a cassette 2B to a height for cassette opening/closing, and opens the cassette 2B.

Subsequently, under the control of the controller 11, the mask transport mechanism 8 extracts the mask 1B from a corresponding cassette 2 in the cassette opening/closing unit 4 with the holding hand 8a again (504), extracts the inspected mask 1A from the inspection device 6 with the holding hand 8a (505), and transfers the mask 1B held by the holding hand 8a to the inspection device 6 (506). Under the control of the controller 11, the mask transport mechanism 8 also transfers the mask 1A held by the holding hand 8b to the prealignment device 7 (507).

After this, the controller 11 controls the respective units 4, 8, and 6 such that the masks (that is, masks 1C and 1D) are transported in the same manner until the maximum number NUM of masks that can be extracted from the cassettes 2 at one time becomes 4.

After the mask 1A is prealigned on the prealignment device 7 with reference to, e.g., its outer circumference, it is held by the holding hand 10a of the mask manipulating mechanism 10 under the control of the controller 11, and is transported onto the mask stage 9 (508 and 509). After that, the mask 1A is finely aligned on the mask stage 9. For example, fine alignment is performed by aligning a positioning mark (not shown) formed on the mask 1A with the reference position. After the fine alignment, the mask 1A is illuminated by the illumination system (not shown), and its pattern is projected onto the wafer through the projection optical system (not shown). Thus, the wafer is exposed with the pattern of the mask 1A.

While the wafer is being exposed by using the mask 1A, under the control of the controller 11, the mask transport mechanism 8 transfers the mask 1B to the prealignment device 7 with its holding hand 8b (510), and prealignment with the prealignment device 7 is completed. The mask 1C is inspected by the inspection device 6, and held on the holding hand 8b of the mask transport mechanism 8 (511). The mask 1D is held on the inspection table of the inspection device 6 (512).

When exposure using the mask 1A is ended, the mask management table 40a is updated such that MT1=1B, MT2= 1C, and MT3=1A, like the mask management table 40b shown in FIG. 4B. Under the control of the controller 11, the masks 1A and 1B are held by the holding hands 10a and 10b, respectively, of the mask manipulating mechanism 10 (513 and 514), and are transported to the prealignment device 7 and mask stage 9, respectively (515 and 516). The mask 1B is positioned in the same manner as the mask 1A, and is used for exposure.

Subsequently, under the control of the controller 11, the mask 1A is extracted from the prealignment device 7 by the holding hand 8a of the mask transport mechanism 8 (517). The mask 1C is transferred to the prealignment device 7 by the holding hand 8b, and is prealigned.

As the mask 1A used will be used again in the third turn as shown in FIG. 4B, it is not recovered in the cassette 2, but is kept held by the holding hand 8a of the mask transport mechanism 8. The wafer is further exposed by using the mask 1C, thus completing triple exposure of one wafer. The process of performing triple exposure of each wafer while exchanging the masks is repeated in accordance with this procedure until exposure of the last wafer is started.

When exposure of the last wafer with the mask 1A is ended, the mask management table 40b is updated such that MT1=1B, MT2=1C, MT3=1D, and MT4=1A, like the mask management table 40c shown in FIG. 4C. The masks 1A and 1B are held by the holding hands 10a and 10b, respectively, of the mask manipulating mechanism 10 (518 and 519), and are transported onto the prealignment device 7 and mask stage 9, respectively (520 and 521).

Manipulation for the masks 1B and 1C is the same as that described above. The mask 1A will be used in the fourth turn as shown in FIG. 4C. Thus, under the control of the controller 11, the mask 1A is extracted from the prealignment device 7 by the holding hand 8a (521), and is exchanged for the mask 1D on the inspection table of the inspection device 6 (522 and 523).

When exposure using the mask 1B is ended, the mask management table 40c is updated like the mask management table 40d shown in FIG. 4D. As the mask 1B will not be used until the fourth turn, it is accommodated in the cassette 2. More specifically, under the control of the controller 11, the masks 1B and 1C are held by the holding hands 10a and 10b, respectively, of the manipulating mechanism 10 (524 and 525), and are transported onto the prealignment device 7 and mask stage 9, respectively (526 and 527). Under the control of the controller 11, the mask 1B is returned to the corresponding cassette in the opening/closing unit 4 by the holding hand 8a of the mask transport mechanism 8 (529). Meanwhile, the mask 1C is positioned, and is used for exposure.

Subsequently, under the control of the controller 11, the opening/closing unit 4 opens a cassette 2 that accommodates the mask 1E. Under the control of the controller 11, the mask transport mechanism 8 extracts the mask 1E with its holding hand 8a from the corresponding cassette 2 in the opening/closing unit 4 (530), extracts the inspected mask 1A with the holding hand 8b from the inspection device 6 (531), and transfers the mask 1E held by the holding hand 8a to the inspection device 6 (532).

After this, the controller 11 controls transport of masks and operations associated with it in the same manner as described above in accordance with the mask management tables.

The control operation of the controller 11 is summarized as follows. When the controller 11 is to recover the mask 1 used for exposure from the mask stage 9 with the mask transport mechanism 8 through the prealignment device 7, it determines the position where the mask 1 is to be held or to wait by looking up the mask management tables as shown in FIGS. 4A to 4D. More specifically, the controller 11 specifies the turn in the use order of the mask 1, which is to be recovered from the mask stage 9, by looking up the use order table 402, and checks whether or not the number of the turn in the use order is equal to or smaller than the maximum number (NUM) 401 of masks that can be extracted at one time from the cassette (that is, masks that can be held by the mask stage 9, prealignment device 7, mask transport mechanism 8, and inspection device 6 in the use order). If the number of the turn in use order of the mask 1 that should be recovered from the mask stage 9 is larger than the maximum number (NUM) 401, the controller 11 causes the mask transport mechanism 8 to accommodate the mask 1 in the corresponding cassette in the cassette opening/closing unit 4.

When the number of the turn in use order of the mask 1 that should be recovered from the mask stage 9 is equal to or smaller than the maximum number (NUM) 401, the controller 11 causes the prealignment device 7, a holding hand of the mask transport mechanism 8, or the inspection device 6 to hold the mask 1 in accordance with the use order. More specifically, when the turn in use order is second, the controller 11 causes the prealignment device 7 to hold the mask 1. When the turn in use order is third, the controller 11 causes a holding hand of the mask transport mechanism 8 to hold the mask 1. When the turn in use order is fourth, the controller 11 arranges the mask 1 on the inspection device 6. The mask 1 held by or arranged on the prealignment device 7 (the second mask, that is, a mask that is to be used next to the mask which is currently mounted on the mask stage 9) is transferred to the mask stage 9 directly by the mask manipulating mechanism 10. The mask 1 held by a holding hand of the mask transport mechanism 8 (the third mask, that is, a mask that is to be used next to the mask which is currently held by the prealignment device 7) is transferred to the prealignment device 7, and is then to the mask stage 9 by the manipulating mechanism 10. The mask 1 held by or arranged on the inspection device 6 (the fourth mask, that is, a mask that is to be used next to the mask which is currently held by the holding hand of the mask transport mechanism 8) is transferred to the holding hand of the mask transport mechanism 8, then to the prealignment device 7, and then to the mask stage 9 by the manipulating mechanism 10.

When no inspection device 6 is provided or is to be used, the controller 11 arranges the mask on the prealignment device 7 if the mask is the one which is to be used in the second turn, causes the mask to be held by the holding hand of the mask transport mechanism 8 if the mask is the one which is to be used in the third turn, and causes the mask transport mechanism 8 to accommodate the mask in the corresponding cassette in the cassette opening/closing unit 4 if the mask is the one which is to be used in the fourth turn.

In place of or in addition to the inspection device 6, another device may be provided to the master transport apparatus. For example, when one or a plurality of devices are provided in addition to the inspection device 6, the maximum number of masks (NUM) that can be extracted from the cassettes at one time can be set to 5 or more.

Furthermore, the mask transport mechanism 8 may have three or more holding hands. In this case, since the mask transport mechanism 8 can manipulate one mask while holding two or more masks, the maximum number of masks that can be extracted from the cassettes at one time can be set to 5 or more.

In the above embodiment, the number of slots of the opening/closing unit 4 is 5. However, the number of slots can be determined arbitrarily. For example, when the number of slots of the opening/closing unit 4 is smaller than the maximum number of masks that can be extracted from the cassettes at one time, empty cassettes may be temporarily returned to the library 3 when necessary.

As described above, according to the preferred embodiment of the present invention, the mask transport mechanism 8 having at least the two holding hands 8a and 8b is provided as a device that transports the mask among the opening/closing unit 4, inspection device 6, and prealignment device 7. A plurality of masks are arranged (prepared) on the mask stage 9 (the device where a mask which is to be used first is to be arranged), prealignment device 7 (the device where a mask which is to be used second is to be arranged), holding hand 8a or 8b (the device where a mask which is to be used third is to be arranged), and inspection device 6 (the device where a mask which is to be used fourth is to be arranged) in accordance with the use order, so that the masks may be exchanged quickly. This can greatly increase the throughput. This advantage can be obtained not only in multiple exposure but also in a small-lot exposure process.

According to the preferred embodiment of the present invention, the frequency with which a mask that has been extracted from a cassette once is returned to the cassette decreases. Thus, mask contamination which results from returning the mask to the cassette is decreased, and furthermore a foreign substance inspection that may be necessary again when the mask is returned to the cassette can be omitted.

With the master transport method using the master transport apparatus as described above, a high throughput can be obtained regardless of whether the master needs to be exchanged. Accordingly, device manufacture to which this method is applied also provides a novel, useful effect.

With a device manufacturing method according to a preferred embodiment of the present invention, a plurality of masters (e.g., first to third masters, or first to fourth masters) are arranged on the master stage in the use order in accordance with the master transport method described above. Each time a master is arranged on the master stage, the pattern of the arranged master is transferred to a substrate coated with a photosensitive agent. The pattern may be transferred to the substrate by multiple exposure, or by one exposure. The photosensitive agent on the substrate to which the pattern has been transferred is developed afterwards. For example, a desired pattern can be formed by processing (e.g., etching) an underlying layer by using the developed photosensitive agent as the mask pattern. This process is called a photolithography process. A desired device can be obtained by repeating the photolithography process.

According to the present invention, for example, a decrease in throughput caused by, e.g., master exchange can be suppressed.

As many apparently widely different embodiments of the present invention can be made without departing from the spirit and scope thereof, it is to be understood that the invention is not limited to the specific embodiments thereof except as defined in the claims.

What is claimed is:

1. A master transport apparatus which transports a master to an exposure apparatus having a master stage, a prealignment device which prealigns a master to be transferred to said master stage, and a manipulating mechanism which transports the master or exchanges two masters between said master stage and prealignment device, the exposure apparatus being arranged to expose a substrate with a pattern of the master, the master transport apparatus comprising:
   a transport mechanism which holds the master with a holding portion that can hold at least two masters and transports the master; and
   a control section which controls said transport mechanism,
   wherein said control section controls said transport mechanism such that, when a master that should be used in a first turn for exposure is to be mounted on said master stage, a master to be used in a second turn is provided to said prealignment device, and a master to be used in a third turn is held by said holding portion.

2. The apparatus according to claim 1, wherein said control section controls said transport mechanism such that, when a master that has been used for exposure in said exposure apparatus should be used for next exposure in a turn a number of which is not larger than that of a predetermined turn, the master is held by said prealignment device if the turn thereof is second, and the master is held by said holding portion if the turn thereof is third, and controls said transport mechanism such that, as far as a number of the turn of the master is larger than that of the predetermined turn, the master is returned to a master supply section.

3. The apparatus according to claim 1, wherein said control section controls said transport mechanism such that, when a master that should be used first for exposure is to be mounted on said master stage, a master to be used in a fourth turn is provided to an additional device that inspects, manipulates, or processes the master.

4. The apparatus according to claim 3, wherein said additional device includes a device that inspects a foreign substance attaching to the master.

5. The apparatus according to claim 3, wherein said control section controls said transport mechanism such that, as far as a master that has been used for exposure in said exposure apparatus should be used for next exposure in a turn a number of which is not larger than that of a predetermined turn, the master is held by said prealignment device if the turn thereof is second, the master is held by said holding portion if the turn thereof is third, and the master is provided to said additional device if the turn thereof is fourth, and controls said transport mechanism such that, as far as a number of the turn of the master is larger than that of the predetermined turn, the master is returned to a master supply section.

6. The apparatus according to claim 2, wherein said master supply section has a mechanism that holds a cassette to accommodate the master and opens/closes said cassette, and said transport mechanism receives the master from said cassette or transfers a master to said cassette.

7. An exposure apparatus which exposes a substrate with a pattern of a master, comprising:
   a master stage;
   a prealignment device which prealigns a master to be transferred to said master stage;
   a manipulating mechanism which transports the master or exchanges two masters between said master stage and prealignment device;
   a transport mechanism which holds a master with a holding portion that can hold at least two masters and transports the master; and
   a control section which controls said transport mechanism,
   wherein said control section controls said transport mechanism such that, when a master that should be used in a first turn is to be mounted on said master stage, a master to be used in a second turn is provided to said prealignment device, and a master to be used in a third turn is held by said holding portion.

8. The apparatus according to claim 7, wherein said control section controls said transport mechanism such that, when a master that should be used first for exposure is to be mounted on said master stage, a master to be used in a fourth turn is provided to an additional device that inspects, manipulates, or processes the master.

9. The apparatus according to claim 8, wherein said additional device includes a device that inspects a foreign substance attaching to the master.

10. A master transport method of transporting a master to an exposure apparatus having a master stage, a prealignment device which prealigns a master to be transferred to the master stage, and a manipulating mechanism which transports the master or exchanging two masters between the master stage and prealignment device, the exposure apparatus being arranged to expose a substrate with a pattern of the master, the method including:
   a control step of controlling a transport mechanism which holds the master with a holding portion that can hold at least two masters and transports the master, wherein in the control step, the transport mechanism is controlled such that, when a master that should be used in a first turn for exposure is to be mounted on the master stage, a master to be used in a second turn is provided to the prealignment device, and a master to be used in a third turn is held by the holding portion.

11. The method according to claim 10, wherein in the control step, the transport mechanism is controlled such that, when the master that should be used first for exposure is to be mounted on the master stage, a master to be used in a fourth turn is provided to an additional device that inspects, manipulates, or processes the master.

12. A device manufacturing method including steps of:
arranging a first master to be used in the first turn on the master stage in accordance with the master transport method according to claim 10;
arranging a second master to be used in the second turn on the master stage in place of the first master; and
arranging a third master to be used in the third turn on the master stage in place of the second master,
wherein each time one of the first to third masters is arranged on the master stage, a pattern of the arranged master is transferred to a substrate.

13. The method according to claim 12, further including a step of arranging a fourth master to be used in a fourth turn on the master stage in place of the third master, wherein each time one of the first to fourth masters is arranged on the master stage, a pattern of the arranged master is transferred to the substrate.

14. A master transport apparatus which transports a master to an exposure apparatus having a master stage, a prealignment device which prealigns a master to be transferred to said master stage, and a manipulating mechanism which transports the master or exchanges two masters between said master stage and prealignment device, the exposure apparatus being arranged to expose a substrate with a pattern of the master, the master transport apparatus comprising:
a transport mechanism which holds the master with a holding portion that can hold at least two masters and transports the master; and
a control section which controls said transport mechanism,
wherein said control section controls said transport mechanism such that, when a master that has been used for exposure in said exposure apparatus should be used for next exposure in a turn a number of which exceeds a number of locations, including said master stage, prealignment device, and holding portion, where the master is to be held or kept waiting, the master that has been used for exposure is returned to a master supply section.

* * * * *

UNITED STATES PATENT AND TRADEMARK OFFICE
CERTIFICATE OF CORRECTION

PATENT NO. : 6,930,762 B2
DATED : August 16, 2005
INVENTOR(S) : Kohei Yamada

It is certified that error appears in the above-identified patent and that said Letters Patent is hereby corrected as shown below:

Title page,
Item [73], Assignee, "Canon Kabushiki Kasiha, Tokyo (JP)" should read
-- Canon Kabushiki Kaisha, Tokyo (JP) --.

Column 1,
Line 41, "attaching" should read -- attached --.

Column 10,
Line 15, "is then" should read -- is then transferred --.

Signed and Sealed this

Seventh Day of February, 2006

JON W. DUDAS
*Director of the United States Patent and Trademark Office*